US007016753B2

(12) United States Patent
Yamazaki

(10) Patent No.: US 7,016,753 B2
(45) Date of Patent: Mar. 21, 2006

(54) MANAGEMENT SYSTEM FOR PRODUCTION LINE AND MANAGEMENT METHOD FOR PRODUCTION LINE

(75) Inventor: Shunpei Yamazaki, Atsugi (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/265,608

(22) Filed: Oct. 8, 2002

(65) Prior Publication Data

US 2003/0083769 A1 May 1, 2003

(30) Foreign Application Priority Data

Oct. 30, 2001 (JP) .............................. 2001-331971

(51) Int. Cl.
*G06F 19/00* (2006.01)
(52) U.S. Cl. ...................................... 700/121; 700/116
(58) Field of Classification Search ................ 700/115, 700/116, 121
See application file for complete search history.

(56) References Cited

U.S. PATENT DOCUMENTS

| 4,974,166 | A | * | 11/1990 | Maney et al. ................ 700/113 |
| 5,432,702 | A | * | 7/1995 | Barnett ........................ 700/116 |
| 5,536,128 | A | | 7/1996 | Shimoyashiro et al. |
| 5,570,293 | A | * | 10/1996 | Tanaka et al. ............... 700/121 |
| 6,128,084 | A | * | 10/2000 | Nanbu et al. ................ 356/369 |
| 6,131,052 | A | * | 10/2000 | Ban et al. .................... 700/121 |
| 6,192,291 | B1 | * | 2/2001 | Kwon .......................... 700/121 |
| 6,449,522 | B1 | * | 9/2002 | Conboy et al. ............. 700/121 |
| 6,496,747 | B1 | * | 12/2002 | Suzuki ........................ 700/102 |
| 6,529,792 | B1 | * | 3/2003 | Sato et al. ................... 700/121 |
| 6,536,370 | B1 | * | 3/2003 | Paton et al. ................. 116/206 |
| 6,591,162 | B1 | * | 7/2003 | Martin ......................... 700/228 |
| 6,615,098 | B1 | * | 9/2003 | Bode et al. .................. 700/121 |
| 6,618,640 | B1 | * | 9/2003 | Hittner et al. ............... 700/116 |
| 6,823,229 | B1 | * | 11/2004 | Ootani et al. ................ 700/112 |
| 2003/0063555 | A1 | | 4/2003 | Yamazaki |
| 2004/0093108 | A1 | | 5/2004 | Ohtani et al. |

FOREIGN PATENT DOCUMENTS

| JP | 02-117512 | 5/1990 |
| JP | 11-53439 | 2/1999 |
| JP | 2001-298077 | 10/2001 |

* cited by examiner

*Primary Examiner*—Albert W. Paladini
*Assistant Examiner*—Ryan A. Jarrett
(74) *Attorney, Agent, or Firm*—Eric J. Robinson; Robinson Intellectual Property Law Office, P.C.

(57) ABSTRACT

The present invention has been made in order to construct a CIM system that is capable of reducing burden on a host computer and instructing processing conditions by the unit of substrate and a start order of work by the unit of substrate. In the present invention, a recipe applied to each substrate is managed in each manufacturing apparatus rather than being managed in a host computer. One or a plurality of numbered recipes are stored in each manufacturing apparatus. With the structure described above, even if decision of a recipe and an order of work of a manufacturing apparatus is managed by the unit of substrate rather than by the unit of carrier, since it is unnecessary to manage concrete contents of a recipe for each substrate in each manufacturing apparatus in the host computer, burden on the host computer can be reduced.

22 Claims, 9 Drawing Sheets

FIG. 4

| PROCESS | APPARATUS TO BE USED | NUMBER OF TIMES OF USE | RECIPE NUMBER |
|---|---|---|---|
| CLEANING OF SUBSTRATE | APPARATUS A | | 1 |
| FORMATION OF BASE FILM | APPARATUS B | 1st TIME | 5 |
| FORMATION OF AMORPHOUS SILICON FILM | APPARATUS B | 2nd TIME | 4 |
| CONTROL OF THRESHOLD VALUE BY DOPING OF N-TYPE IMPURITY | APPARATUS C | | 2 |
| FORMATION OF POLYCRYSTAL SILICON FILM BY LASER CRYSTALLIZATION | APPARATUS D | | 1 |
| APPLICATION OF RESIST | APPARATUS E | | 1 |
| EXPOSURE OF RESIST | APPARATUS F | | 3 |
| FORMATION OF SEMICONDUCTOR FILM OF ISLAND SHAPE BY ETCHING OF POLYCRYSTAL SILICON FILM | APPARATUS G | | 3 |
| FORMATION OF GATE INSULATING FILM | APPARATUS B | 3rd TIME | 5 |
| FORMATION OF CONDUCTIVE FILM | APPARATUS H | | 4 |
| APPLICATION OF RESIST | APPARATUS E | 2nd TIME | 7 |
| EXPOSURE OF RESIST | APPARATUS F | 2nd TIME | 2 |
| FORMATION OF FIRST GATE ELECTRODE BY ETCHING OF CONDUCTIVE FILM | APPARATUS G | | 5 |
| FORMATION OF N-TYPE IMPURITY REGION BY DOPING | APPARATUS C | 2nd TIME | 2 |

FIG. 5

| RECIPE 1 | ACCELERATION VOLTAGE : 80 keV |
| | DOSE AMOUNT : $1\times10^{14}$ atoms/cm$^2$ |
| RECIPE 2 | ACCELERATION VOLTAGE : 120 keV |
| | DOSE AMOUNT : $1\times10^{13}$ atoms/cm$^2$ |
| RECIPE 3 | ACCELERATION VOLTAGE : 100 keV |
| | DOSE AMOUNT : $5\times10^{17}$ atoms/cm$^2$ |
| RECIPE 4 | ACCELERATION VOLTAGE : 40 keV |
| | DOSE AMOUNT : $1\times10^{13}$ atoms/cm$^2$ |
| : | |
| RECIPE m | ACCELERATION VOLTAGE : 20 keV |
| | DOSE AMOUNT : $1\times10^{14}$ atoms/cm$^2$ |

FIG. 9

| | | | A | A | A | B | B | B | B | C | C | C |
|---|---|---|---|---|---|---|---|---|---|---|---|---|
| No. | PROCESS | APPARATUS | 1 | 2 | 3 | 4 | 5 | 6 | 7 | 8 | 9 | 10 |
| 1 | WRITING IN SUBSTRATE ID | LASER MARK APPARATUS | O | O | O | O | O | O | O | O | O | O |
| 2 | CLEANING OF SUBSTRATE | CLEANER | O | O | O | O | O | O | O | O | O | O |
| 3 | FORMATION OF BASE SiNO FILM | CVD APPARATUS A | O | O | O | O | O | O | O | O | O | O |
| 4 | FORMATION OF AMORPHOUS SEMICONDUCTOR FILM | CVD APPARATUS A | O | O | O | O | O | O | O | O | O | O |
| 5 | THERMAL CRYSTALLIZATION | ANNEAL APPARATUS A | × | O | O | × | O | × | × | O | × | O |
| 6 | LASER CRYSTALLIZATION | LASER APPARATUS | O | O | O | O | O | O | O | × | O | × |
| 7 | FORMATION OF SiO$_2$ FILM FOR MASK | CVD APPARATUS B | O | O | O | O | O | O | O | × | × | × |
| 8 | B+ CHANNEL DOPE | DOPING APPARATUS | O | O | O | O | O | O | O | O | × | O |
| 9 | ETCHING OF SiO2 (WET) | ETCHING APPARATUS A | O | O | O | O | O | O | O | O | O | O |
| 10 | PATTERNING OF POLYCRYSTAL SEMICONDUCTOR FILM | PATTERN FORMING APPARATUS | O | O | O | O | O | O | O | O | O | O |
| 11 | ETCHING OF POLYCRYSTAL SEMICONDUCTOR FILM (DRY) | ETCHING APPARATUS C | O | O | O | O | O | O | O | O | O | O |
| 12 | FORMATION OF GATE INSULATING FILM | CVD APPARATUS A | O | O | O | O | O | O | O | O | O | O |
| 13 | FORMATION OF CONDUCTIVE FILM | SPUTTERING APPARATUS A | O | O | O | O | O | O | O | O | O | O |
| 14 | APPLICATION OF RESIST | APPLICATION APPARATUS | O | O | O | O | O | O | O | O | O | O |
| 15 | EXPOSURE | EXPOSURE APPARATUS | O | O | O | O | O | O | O | O | O | O |
| 16 | PATTERNING OF CONDUCTIVE FILM | PATTERN FORMING APPARATUS | O | O | O | O | O | O | O | O | O | O |
| 17 | RESIST BAKE | ANNEAL APPARATUS B | × | × | O | O | O | O | O | O | O | O |
| 18 | ETCHING OF CONDUCTIVE FILM (DRY) | ETCHING APPARATUS B | O | O | O | O | O | O | O | O | O | O |
| 19 | P HEAVY DOPE | DOPING APPARATUS | O | O | O | O | O | O | O | O | O | O |
| 20 | ETCHING OF CONDUCTIVE FILM (DRY) | ETCHING APPARATUS D | O | O | O | O | O | O | O | O | O | O |
| 21 | RESIST STRIPPING | STRIPPING APPARATUS | O | O | O | O | O | O | O | O | O | O |
| 22 | P LIGHT DOPE | DOPING APPARATUS | O | O | O | O | O | O | O | O | O | O |
| 23 | PATTERNING OF B+ REGION | PATTERN FORMING APPARATUS | × | × | O | O | O | O | O | O | O | O |
| 24 | B LIGHT DOPE | DOPING APPARATUS | O | O | O | O | O | O | O | O | O | O |
| 25 | B HEAVY DOPE | DOPING APPARATUS | O | O | O | O | O | O | O | O | O | O |
| 26 | FORMATION OF FIRST INTERLAYER INSULATING FILM (SiNO) | CVD APPARATUS B | O | O | O | O | O | O | O | O | O | O |
| 27 | THERMAL ACTIVATION | ANNEAL APPARATUS C | O | O | O | O | O | O | O | O | O | O |
| 28 | FORMATION OF SECOND INTERLAYER INSULATING FILM (SiO$_2$) | CVD APPARATUS B | O | O | O | O | O | O | O | O | O | O |
| 29 | FORMATION OF CONTACT HOLE | PATTERN FORMING APPARATUS | O | O | O | O | O | O | O | O | O | O |
| 30 | PATTERNING OF FIRST INTERLAYER INSULATING FILM (WET) | ETCHING APPARATUS A | O | O | O | O | O | O | O | O | O | O |
| 31 | ETCHING OF SECOND INTERLAYER INSULATING FILM (DRY) | ETCHING APPARATUS C | O | O | O | O | O | O | O | O | O | O |
| 32 | FORMATION OF CONDUCTIVE FILM FOR WIRING | SPUTTERING APPARATUS A | O | O | O | O | O | O | O | O | O | O |
| 33 | ETCHING OF CONDUCTIVE FILM FOR WIRING (DRY) | ETCHING APPARATUS D | O | O | O | O | O | O | O | O | O | O |
| 34 | RESIST STRIPPING | STRIPPING APPARATUS | O | O | O | O | O | O | O | O | O | O |
| 35 | FORMATION OF ITO FILM | SPUTTERING APPARATUS B | O | O | O | O | O | O | O | O | O | O |
| 36 | PATTERNING OF ITO | PATTERN FORMING APPARATUS | O | O | O | O | O | O | O | O | O | O |
| 37 | ETCHING OF ITO (WET) | ETCHING APPARATUS B | O | O | O | O | O | O | O | O | O | O |
| 38 | RESIST STRIPPING | STRIPPING APPARATUS | O | O | O | O | O | O | O | O | O | O |
| 39 | SHIPMENT INSPECTION | INSPECTION APPARATUS | O | O | O | O | O | O | O | O | O | O |
| 40 | PACKING | | O | × | × | O | O | O | O | O | O | O |

MANAGEMENT SYSTEM FOR PRODUCTION LINE AND MANAGEMENT METHOD FOR PRODUCTION LINE

BACKGROUND OF THE INVENTION

1. Field of the Invention

The present invention relates to a management system and a management method for managing a production line of a semiconductor device that is produced through a large number of processes.

2. Description of the Related Art

A well-known semiconductor device such as a very large scale integration (VLSI) is completed as a product through a large number of processes. As a production system for the semiconductor device, production means called a job shop system is employed in which same types of manufacturing apparatuses collectively to be laid out in a factory to constitute equipment groups and a substrate that is an object to be processed moves back and forth among those equipment groups to be produced as a product. Note that, in this specification, a manufacturing apparatus includes an apparatus used in an inspection process.

In general, approximately twenty substrates are stored in a carrier, and the carrier is automatically conveyed between each equipment group. With the automation of conveyance, a substrate can be kept away from a worker, yield can be improved and loss of time caused by waiting for a worker at equipment can be eliminated. The conveyed substrate is subjected to desired processing at each manufacturing apparatus.

Manufacturing apparatuses of a semiconductor device are mainly classified into a batch processing type and a sheet processing type.

Since few kinds of semiconductors typified by a memory product are produced in a large quantity in a conventional semiconductor production, the mainstream of a manufacturing apparatus is the batch processing type that is capable of simultaneously processing substrates in the order of a few pieces to 100 pieces. However, with the manufacturing apparatus of the batch processing type, although efficiency of substrate processing is high, it is difficult to keep high process capability and it is also difficult to flexibly cope with production of various types of semiconductors in a small quantity for dealing with diversification of products that is required in the market recently.

On the other hand, in the case of the manufacturing apparatus of the sheet processing type, since substrates can be processed one by one, it is possible to flexibly cope with the production of various types of semiconductors in a small quantity. In addition, the sheet processing type has advantages in that a time period from the time when a substrate is taken out of a carrier until the time when a substrate after processing returns to a predetermined position, a so-called tact time, is short, processing adapted to a state of respective substrates is possible, and a time period after chemical treatment until rinse is short (displacement efficiency is high), and so on. Thus, the sheet processing type is becoming the mainstream of a manufacturing apparatus for a semiconductor.

Processing of a substrate in each manufacturing apparatus may be applied based on a recipe (processing condition) that is different depending on a type or the like of a product to be manufactured. In particular, as demands for the production of various types of semiconductors in a small quantity increase, this tendency is becoming stronger. In such a case, it is necessary to classify substrates for each lot and switch a recipe of the manufacturing apparatus every time the classification of lots is changed. A lot is a collection of substrates that are moved and processed together along a flow of a process and means a unit of production or shipment.

Then, in a factory for producing various types of semiconductor devices, switching of a recipe in each manufacturing apparatus is generally performed using a system for integrating planning, designing and manufacturing based on a common database, a so-called CIM (Computer Integrated Manufacturing) system. By using the CIM system, control for each manufacturing apparatus in a production line can be collectively managed by a computer.

A recipe that should be performed by each manufacturing apparatus is controlled one by one from the computer using the CIM system, whereby it is possible to avoid changing of a recipe of the manufacturing apparatus via manual work as much as possible. Thus, burden on a worker can be reduced and a decline in cleanliness of a clean room due to dusts from people can be controlled.

Note that as necessity for realizing observance of a date of delivery of a trial product or a product of an important customer arises or the tendency of the production of various types of semiconductors in a small quantity becomes stronger, types of lots increase and the number of substrates to be classified into the same lot decreases. In this case, if substrates, all of which are always classified into the same lot, are stored in each carrier, the number of substrates for each carrier decreases and a decline in efficiency of substrate processing is caused. Thus, it is desirable to store substrates classified into different lots in the same carrier together and convey the substrates.

If all the substrates stored in the carrier are classified into the same lot, decision of a recipe or a start order of work of the manufacturing apparatus can be managed by the unit of carrier. However, if substrates classified into different lots are stored in the same carrier together, it is necessary to manage decision of a recipe or a start order of work of the manufacturing apparatus by the unit of substrate.

However, if a recipe or a start order of work of the manufacturing apparatus is managed by the unit of substrate using the CIM system, an amount of information to be managed becomes enormous and burden on a computer to be a host (host computer) increases compared with the management by the unit of carrier. In addition, since it is necessary to exchange data of a large amount of information such as concrete contents of a recipe for each substrate between the host computer and each manufacturing apparatus, transmission and reception of data take time and high performance is required of the host computer.

SUMMARY OF THE INVENTION

The present invention has been devised in view of the above and other drawbacks, and it is an object of the present invention to construct a CIM system that is capable of reducing burden on a host computer and instructing processing conditions by the unit of substrate and a start order of work by the unit of substrate.

In the present invention, a recipe applied to each substrate is managed in each manufacturing apparatus rather than being managed in a host computer. One or a plurality of numbered recipes are stored in each manufacturing apparatus.

The host computer manages a flow of a process of each lot, for example, in which order substrates are conveyed to each manufacturing apparatus and under which recipe number a substrate is processed, in each lot. Note that a lot is a collection of substrates that are moved and processed together along a flow of a process and means a unit of production and shipment. Upon receiving a lot number of a substrate conveyed to a manufacturing apparatus from the manufacturing apparatus as information, the host computer finds a recipe number to be processed of the substrate based on the lot number and the manufacturing apparatus to which the substrate is conveyed to send the recipe number to the manufacturing apparatus as information.

Upon receiving the recipe number as information, the manufacturing apparatus reads out a recipe corresponding to the recipe number and processes the substrate in accordance with the recipe. When the processing is completed, information to that effect is sent to the host computer as information. When the completion of processing of all the substrates are confirmed, the host computer controls some conveying means to convey the carrier in which the processed substrates are stored to a manufacturing apparatus in which the next processing is performed.

With the above-mentioned structure, since it is unnecessary to manage concrete contents of a recipe for each substrate in each manufacturing apparatus in the host computer even if decision of a recipe and a start order of work of a manufacturing apparatus is managed by the unit of substrate rather than the unit of carrier, burden on the host computer can be reduced. In addition, since it becomes unnecessary to exchange data of a large amount of information such as concrete contents of a recipe for each substrate, time required for transmission and reception of data can be controlled and high performance is not required of the host computer.

In addition, since substrates can be stored in a carrier regardless of a type of a lot, a ratio of the number of substrates that are actually stored to the number of substrates that can be stored in the carrier can be increased, and conveyance of a substrate between each manufacturing apparatus can be performed efficiently.

Other objects and features of the present invention will be apparent from the following descriptions taken in conjunction with the accompanying drawings, in which like reference characters designate the same or similar parts throughout the figures thereof.

BRIEF DESCRIPTION OF THE DRAWINGS

In the accompanying drawings:

FIG. 4 is a table of processes showing a relationship between the number of times a manufacturing apparatus is used and a recipe number;

FIG. 5 shows concrete contents of each recipe in a doping apparatus;

FIG. 9 is a table of processes showing an example of a table of processes stored in a memory of the host computer.

DETAILED DESCRIPTION OF THE PREFERRED EMBODIMENTS

Next, a configuration of the present invention will be described in detail.

Figure 1:
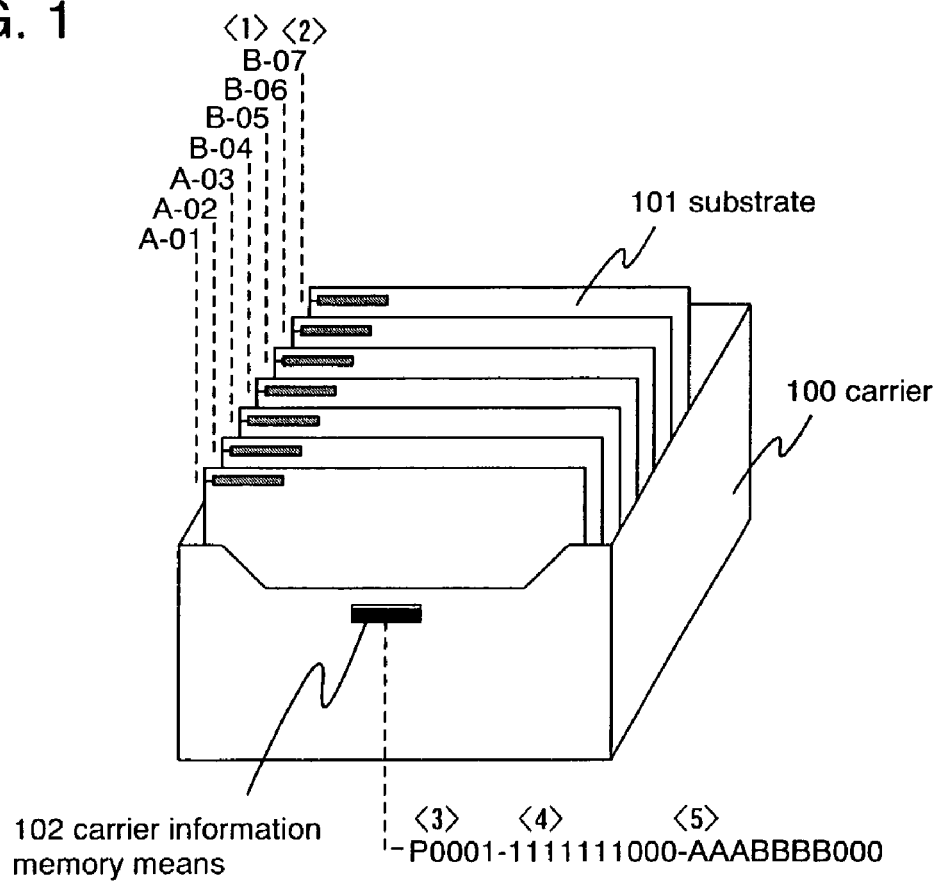
FIG. 1 is a view showing a structure of a carrier used in the present invention.

In the present invention, an ID number (substrate ID) is appended for each substrate to be an object to be processed and an ID number (carrier ID) is appended for each carrier. FIG. 1 shows a schematic view of a carrier used in the present invention. In a carrier 100 shown in FIG. 1, a plurality of substrates 101 that are objects to be processed are stored. It is possible for a worker to appropriately set the number of substrates that can be stored. Further, in this specification, a part where each substrate is held in the carrier is called a slot. The more slots there are, substrates of a larger number can be stored.

A classification of a lot to which a substrate belongs may be appended as a lot number to each substrate 101 in addition to the substrate ID. In this way, information that a designer considers necessary can be written on a substrate appropriately. By directly appending a lot number to a substrate, a worker can directly visually distinguish a lot of the substrate. It is sufficient for these numbers appended to each substrate to distinguish each substrate, and characters, numerals, bar codes and other symbols can be used as the numbers.

In FIG. 1, <1> corresponds to a lot number and <2> corresponds to a substrate ID. These numbers appended to each substrate may be appended with either ink or laser. Alternatively, the numbers may be written in the substrate using other methods.

In addition, memory means 102 capable of rewriting data magnetically (hereinafter referred to as carrier information memory means) is provided in each carrier. A carrier ID and a lot number of each substrate 101 stored in the carrier are stored in the carrier information memory means 102. Moreover, in addition to the numbers, information that a designer considers necessary such as a state of storage of substrates in each slot of a carrier, substrate IDs of stored substrates, the number of times of conveyance of a carrier for realizing timing for cleaning the carrier, and the like, may be stored as information appropriately. In FIG. 1, <3>, <4> and <5> correspond to a carrier ID, a state of storage in each slot and a lot number of a substrate stored in each slot, respectively, which are stored in the carrier information memory means 102.

Further, the carrier information memory means 102 may be any memory means as long as it is capable of rewriting data, and does not always have to be memory means that rewrites data magnetically.

In addition, the carrier shown in FIG. 1 is a carrier called an open cassette with a cover not closed and a container opened. The carrier used in the present invention is not limited to this structure, and a carrier of a box type with a container closed may be used.

Figure 2:
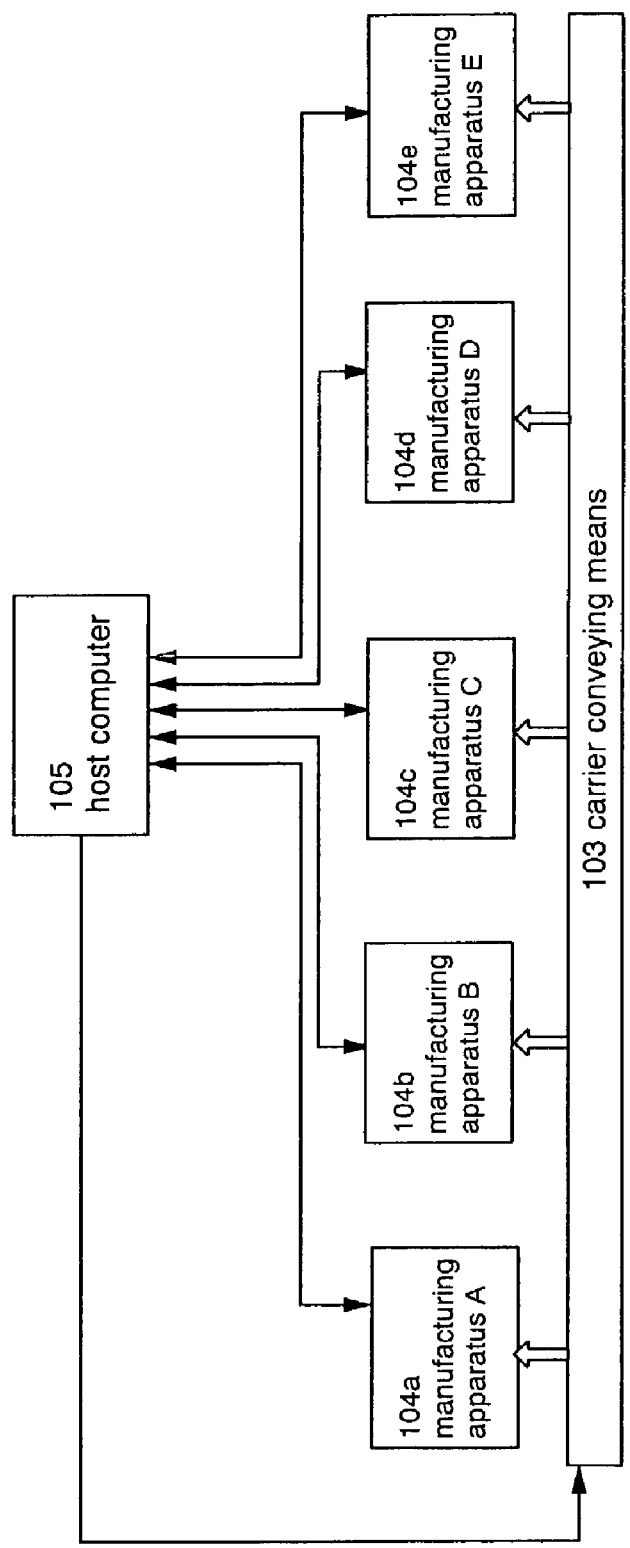
FIG. 2 is a diagram showing a relationship among a host computer, manufacturing apparatuses and a carrier conveying means.

Each carrier 100 in which the substrates 101 are stored is automatically carried by carrier conveying means 103 between each manufacturing apparatus. FIG. 2 shows a relationship among the carrier conveying means 103, each manufacturing apparatus and a host computer 105. In FIG. 2, five manufacturing apparatuses consisting of a manufacturing apparatus A 104*a*, a manufacturing apparatus B 104*b*, a manufacturing apparatus C 104*c*, a manufacturing apparatus D 104*d* and a manufacturing apparatus E 104*e* are shown. However, the number of manufacturing apparatuses may be set arbitrarily.

An ID number (apparatus ID) is appended to each manufacturing apparatus.

The host computer 105 controls the carrier conveying means 103 and conveys the carrier 100 to a manufacturing apparatus having a designated apparatus ID. Note that, although the carrier 100 is automatically conveyed between each manufacturing apparatus, the conveyance may be switched to manual in the host computer 105 to convey the carrier 100 manually if necessary.

When the carrier 100 is conveyed to a designated manufacturing apparatus, necessary information among information stored in the carrier information memory means 102 is read in the manufacturing apparatus. It will be hereinafter described with reference to FIG. 3 how a manufacturing apparatus and the host computer 105 operate based on the read information.

Figure 3:
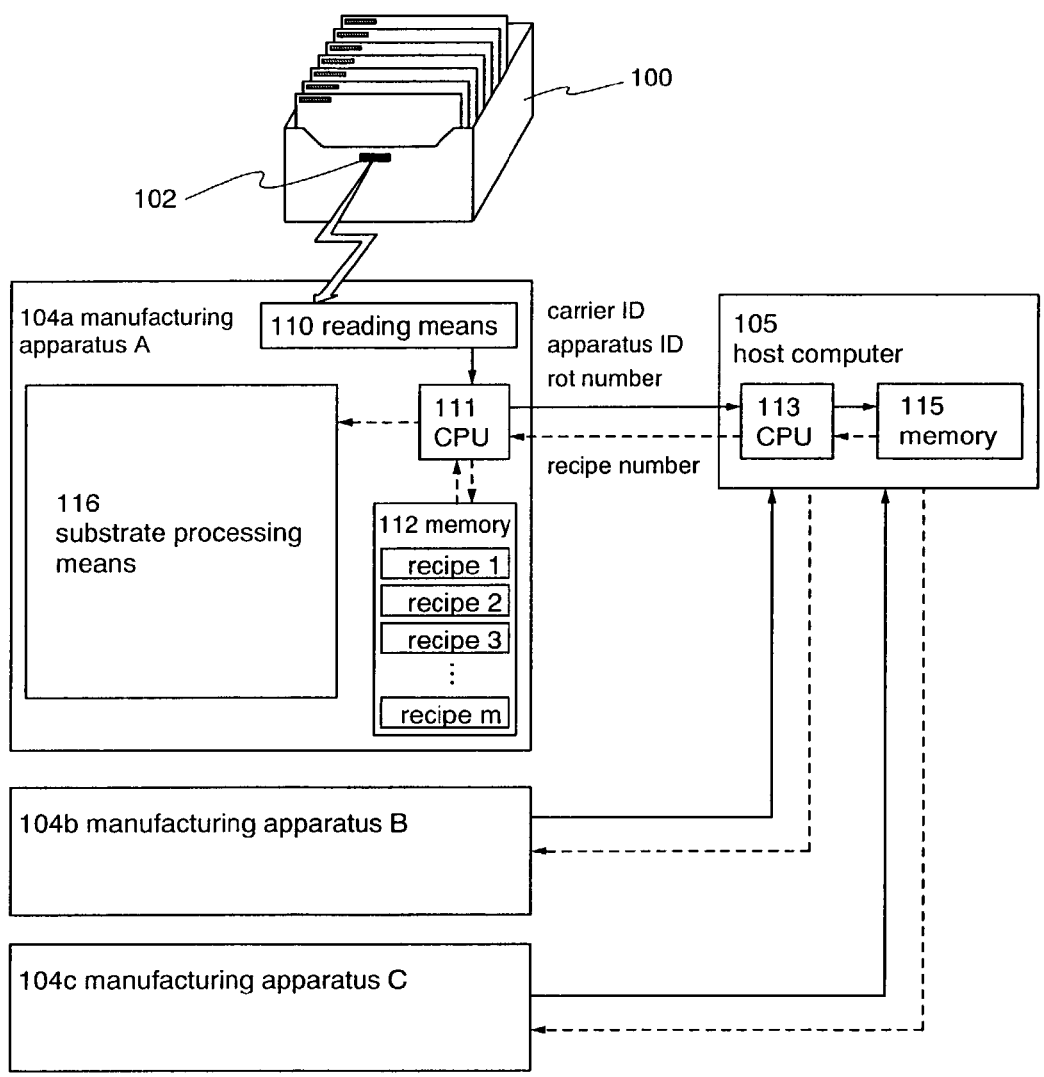
FIG. 3 is a diagram showing operations of the host computer and the manufacturing apparatuses at the time when the carrier is conveyed.

In FIG. 3, operations of a manufacturing apparatus and the host computer 105 at the time when a carrier is conveyed will be described with the manufacturing apparatus A 104*a* as an example. Each manufacturing apparatus is provided with reading means 110 for reading information stored in the carrier information memory means 102 provided in the carrier 100 conveyed to the manufacturing apparatus. In addition, each manufacturing apparatus is further provided with a CPU 111, a memory 112 in which recipes of substrate processing are stored and substrate processing means 116.

Then, a carrier ID and a lot number of a substrate stored in each slot are read in the reading means 110 and sent to the CPU 111. The CPU 111 sends the read carrier ID and lot number of a substrate stored in each slot and an apparatus ID of the manufacturing apparatus in which the CPU 111 is provided to a CPU 113 of the host computer 105.

The CPU 113 grasps to which lot each substrate belongs based on the lot number sent to it. A recipe number in each process of each lot is stored in a memory 115. Then, based on the lot number of each substrate, the carrier ID and the apparatus ID that have been sent to the CPU 113, the CPU 113 reads out a recipe number of a corresponding process of a lot corresponding to the lot number, which is stored in the memory 115, and sends the recipe number to the CPU 111 of the manufacturing apparatus.

FIG. 9 shows a flow of processes stored in the memory 115, contents of processing in each process, manufacturing apparatuses, presence or absence of processing of each substrate and a lot number of each substrate as an example. Here, an example in which ten substrates classified into three lots, respectively, are stored in one carrier is shown. In the same manner, a flow of processes of each lot is stored. In addition, a recipe number of each process is also stored in addition to the table of processes shown in FIG. 9.

Further, although not shown in FIG. 3, the CPU 113 may use the carrier ID sent to it to count, in a counter circuit provided in the host computer 105, the number of times the carrier is conveyed since a lot is set. Then, the CPU 113 may distinguish a lot corresponding to a lot number stored in the memory 115 based on the lot number sent to it, decide a corresponding process in the lot based on the counted number of times the carrier is conveyed and the apparatus ID sent to it, and read out a recipe number of the process to send it to the CPU 111 of the manufacturing apparatus.

For example, if a lot number is A, a substrate is processed in accordance with a process shown in FIG. 4. Then, if the counted number of times the carrier is conveyed is twice and the apparatus ID corresponds to the manufacturing apparatus E, the CPU 113 can decide that a tenth process of resist application is currently performed and a recipe number is 7.

When the recipe number is received as information in the CPU 111 of the manufacturing apparatus, the CPU 111 reads concrete contents of the recipe corresponding to the recipe number stored in the memory 112 and controls the substrate processing means 116 such that each substrate is processed in accordance with the recipe.

Contents of processing by the substrate processing means 116 vary depending on a type of the manufacturing apparatus. For example, if the manufacturing apparatus is a doping apparatus, it is assumed that recipes as shown in FIG. 5 are stored in a memory of the doping apparatus. Then, if a recipe number is 3, a substrate is processed under the conditions with the recipe of an acceleration voltage 100 keV and a dose amount $5 \times 10^{17}$ atoms/cm$^2$.

Further, in FIGS. 2 and 3, illustration is on the premise that all the manufacturing apparatuses are the sheet processing type. However, a manufacturing apparatus of the batch processing type may be included in a group of manufacturing apparatuses. In the case of the manufacturing apparatus of the batch processing type, if all substrates stored in the same carrier can be subjected to processing with the same recipe, all the substrates can be simultaneously processed. If all the substrates stored in the same carrier cannot be subjected to processing with the same recipe, the substrates are classified for each recipe and are subjected to processing for a plurality of times for each substrate of each recipe.

When processing of all the substrate stored in the carrier is completed, the CPU 111 of the manufacturing apparatus notifies the CPU 113 of the host computer 105 that the processing has been completed. Note that completion of processing may be notified for each substrate. If completion of processing is notified for each substrate, the host computer 105 can meticulously grasp to which substrate the processing has been normally completed.

When the completion of processing of all the substrates is notified, the host computer 105 decides to which manufacturing apparatus the carrier is conveyed. This decision can be made in various methods. When the carrier is conveyed to the apparatus, the host computer 105 may store the carrier ID, the apparatus ID and the lot number sent from the CPU 111 of the manufacturing apparatus in a memory separately provided and decide a manufacturing apparatus that is used in the next process based on the flow of processes stored in the memory 115 according to these numbers. In addition, simultaneously with the notice of the completion of processing from the manufacturing apparatus, the carrier ID, the apparatus ID and the lot number may be sent to the CPU 113 of the host computer 105 again, and the host computer 105 may decide a manufacturing apparatus that is used in the next step based on the flow of processes stored in the memory 115. Further, when the carrier is conveyed to the apparatus, the host computer 105 may read out information of a manufacturing apparatus that is used in the next process based on the carrier ID, the apparatus ID and the lot number sent from the CPU 111 of the manufacturing apparatus and store the information in a memory separately provided.

Then, the host computer 105 designates an apparatus ID of a manufacturing apparatus, to which the carrier 100 is conveyed, with respect to the carrier conveying means 103 shown in FIG. 2, and the conveying means 103 automatically conveys the carrier 100. When the carrier 100 is conveyed to the designated manufacturing apparatus, the information stored in the carrier information memory means 102 is read out again, and the above-mentioned operations are repeated.

Figure 6:
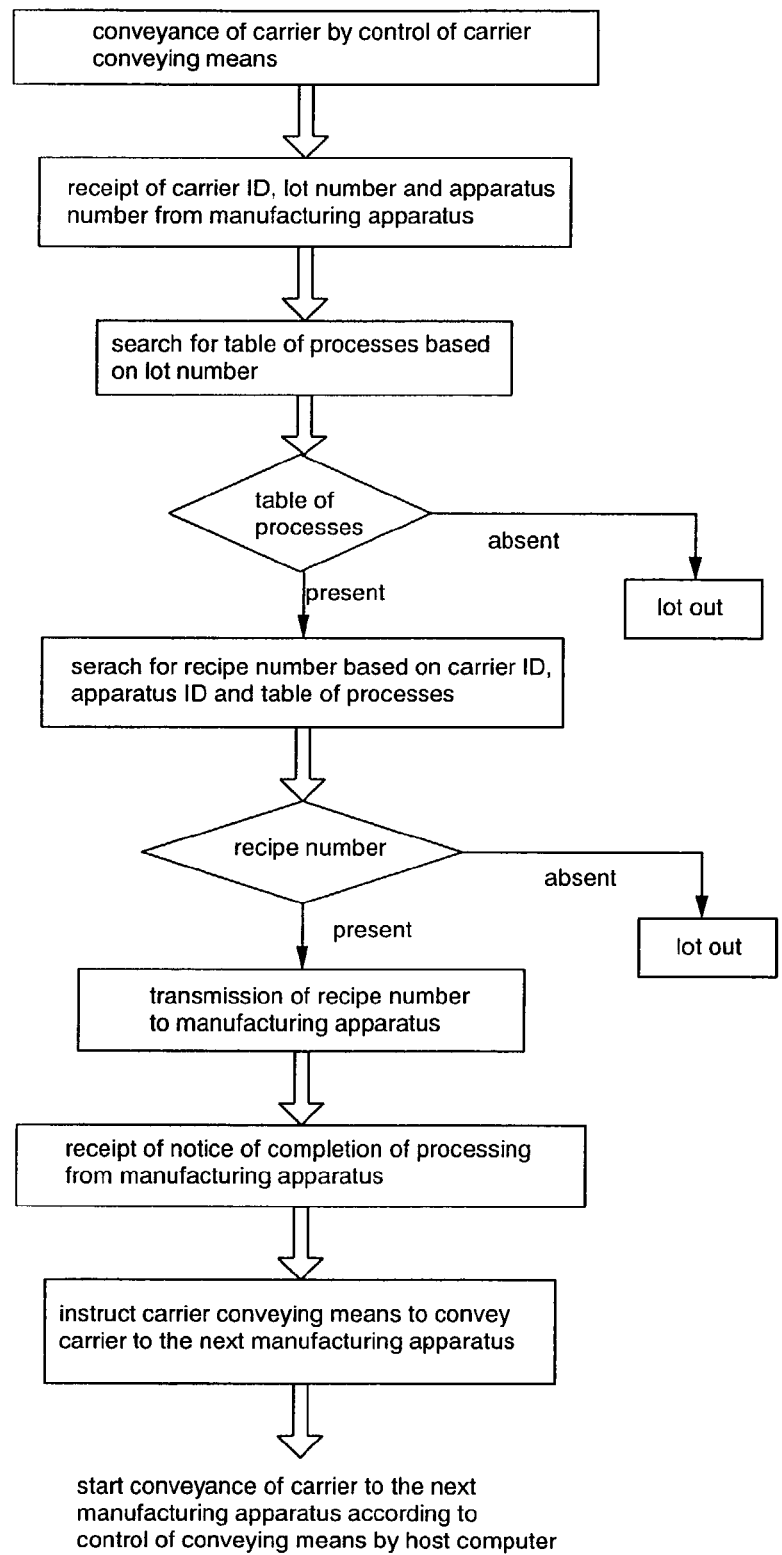
FIG. 6 is a flow chart showing operations of the host computer.

Concerning the above-mentioned operations, a flow chart focusing only on a host computer is shown in FIG. 6. The host computer controls carrier conveying means and conveys a carrier. When the carrier is conveyed to a designated manufacturing apparatus, the host computer receives a carrier ID, a lot number of each substrate, an apparatus ID and the like from the manufacturing apparatus as information.

Then, the host computer searches a flow of processes (table of processes) of a corresponding lot in the memory 115 based on a lot number. If there is no table of processes, the substrate is preliminarily or completely removed from the lot and comes to be lot out, and an appropriate measure is taken by a worker.

If there is a table of processes, the host computer searches a corresponding recipe number in the memory 115 based on a carrier ID, an apparatus ID and the table of processes. If there is no corresponding recipe number, the substrate is preliminarily or completely removed from the lot and comes to be lot out, and an appropriate measure is taken by the worker.

If there is a corresponding recipe number, the host computer sends the recipe number to the manufacturing apparatus. Next, when a notice of completion of processing is sent from the manufacturing apparatus, the host computer searches a manufacturing apparatus, in which the next processing is performed, in the memory 115, and controls carrier conveying means to convey the carrier to a designated manufacturing apparatus.

Figure 7:
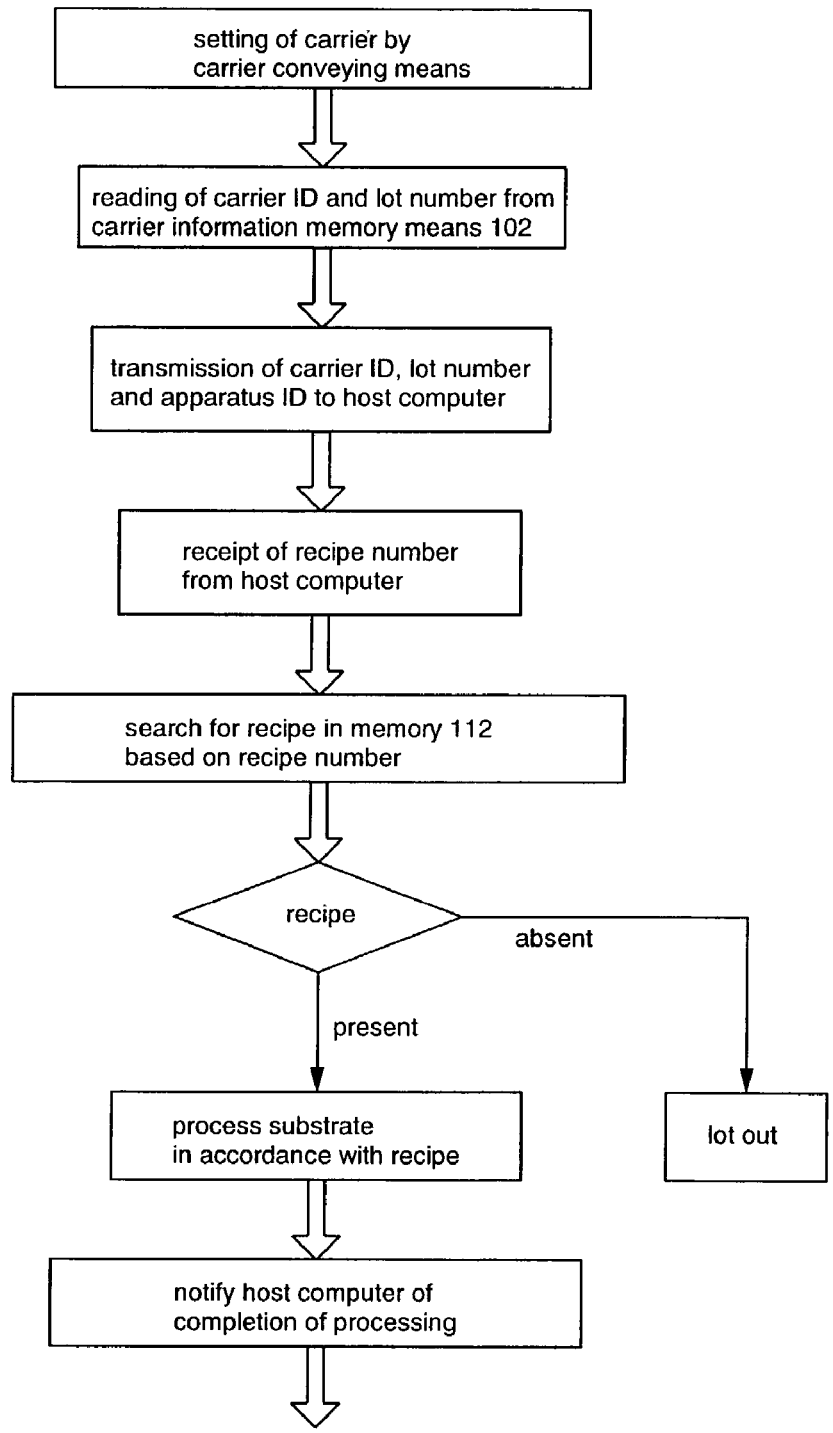
FIG. 7 is a flow chart showing operations of the manufacturing apparatus.

Next, a flow chart focusing only on a manufacturing apparatus is shown in FIG. 7. When a carrier is conveyed by the carrier conveying means 103 and placed in a predetermined position (work piece stocker), a carrier ID and a lot number is read out from the carrier information memory means 102 by the reading means 110.

Then, the read-out carrier ID and lot number and an apparatus ID are sent to a host computer. Next, the manufacturing apparatus receives a corresponding recipe number from the host computer. The manufacturing apparatus searches a corresponding recipe based on the received recipe number in the memory 112.

If there is no corresponding recipe, the host computer is notified to that effect, and the substrate is preliminarily or completely removed from the lot and comes to be lot out, and an appropriate measure is taken by a worker. If there is a corresponding recipe, the substrate is processed in the substrate processing means 116 in accordance with the recipe. When the processing of the substrate is completed, the manufacturing apparatus sends a notice of completion of processing to the host computer.

Note that the manufacturing apparatus may send a notice to the effect that processing of a substrate is started to the host computer as information. It can be confirmed at an early stage if a normal operation is performed in a manufacturing apparatus by sending a notice of start of processing to the host computer.

In addition, although a recipe of a manufacturing apparatus is automatically selected by a host computer in the present invention, a worker may control the host computer to arbitrarily switch selection of a recipe. Further, a worker may manually select a recipe on a manufacturing apparatus side, or it is also possible to set the host computer to prohibit the selection of a recipe on the manufacturing apparatus side by the worker.

In addition, if a manufacturing apparatus is an inspection apparatus, a rank to be an indicator of a quality of a processing state of a substrate obtained from results of inspection may be notified to the host computer together with a notice of completion of the inspection. Further, a substrate ID that has come to be lot out by the inspection may be notified to the host computer together.

Further, if the substrate that has come to be lot out may be directly stored in a carrier and conveyed between each manufacturing apparatus together with other substrates, carrier information memory means may store which substrate has come to be lot out and, when all substrates stored in the carrier have come to be lot out, the carrier may be conveyed out from a manufacturing line.

The above-mentioned management system of a production line or management method of a production line of the present invention can be used in a production line for an integrated circuit or a semiconductor display device. In particular, it can be used in a production line for a liquid crystal display device, a light-emitting device having light-emitting elements represented by an organic light-emitting element in each pixel, a DMD (Digital Micromirror Device), a PDP (Plasma Display Panel), an FED (Field Emission Display) and the like that manages a large number of substrates, which are subjected to sheet processing, by lot, or a management method of the production line.

It should be noted that although the above-mentioned management system of a production line or management method of a production line of the present invention is explained in accordance with information stored in the carrier information memory means, and manages a lot by the unit of carrier, the present invention is not limited to this structure. For example, peculiar information of each substrate such as a lot number, a substrate ID, etc, may be managed in the unit of the substrate. In this case, means for recording the information (substrate information recording means) is provided on each substrate so as to be able to read the information from the outside. Since it is hardly necessary to rewrite the peculiar information of the each substrate, an information memory means which can rewrite the information like the carrier information memory means may not necessarily be provided. A method of laser marking on a substrate, or on a semiconductor film, on an insulating film or on a conductive material formed on the substrate can be listed as recording the information. Also, the information can be recorded by patterning the above mentioned films into an information pattern.

Embodiments of the present invention will be hereinafter described.

[Embodiment 1]

In this embodiment, rewriting of information stored in carrier information memory means will be described.

Rewriting or update of information stored in carrier information memory means may be performed on a worker side or on each manufacturing apparatus side. Rewriting or update of information stored in carrier information memory means is performed in various cases.

Rewriting or update of information is typically performed on the worker side when a carrier ID is first appended to a carrier, when substrates are stored in each slot and a lot number of each substrate and a storing state of each slot are written, and the like. Note that these do not have to be always performed on the worker side but may be performed on the manufacturing apparatus side.

Rewriting or update of information is typically performed on the manufacturing apparatus side when a storing state of each slot is updated in the case in which a substrate is removed from a carrier due to lot out of the substrate, when the number of times of conveyance of a substrate is updated, and the like. In addition, if a substrate that has come to be lot out is directly stored in the carrier and conveyed between each manufacturing apparatus together with other substrates, carrier information memory means may store which substrate has come to be lot out. In this case, information on lot out in the carrier information memory means is updated on the manufacturing apparatus side before conveying the carrier. Note that these do not need to be always performed on the manufacturing apparatus side but may be performed on the worker side.

Further, when writing or update is performed on the manufacturing apparatus side, the host computer may be notified to that effect. In addition, update information of the number of times of conveyance may be sent to the host computer together with a notice of processing of a substrate.

In addition, if a manufacturing apparatus is an inspection apparatus, a rank to be an indicator of a quality of a processing state of a substrate obtained from results of inspection may be written in the carrier information memory means.

Further, a function for displaying information stored in the carrier information memory means may be provided in a carrier such that a worker can make a decision visually.

[Embodiment 2]

In this embodiment, timing of cleaning and a life cycle of a carrier will be described with reference to FIG. 8.

Figure 8:
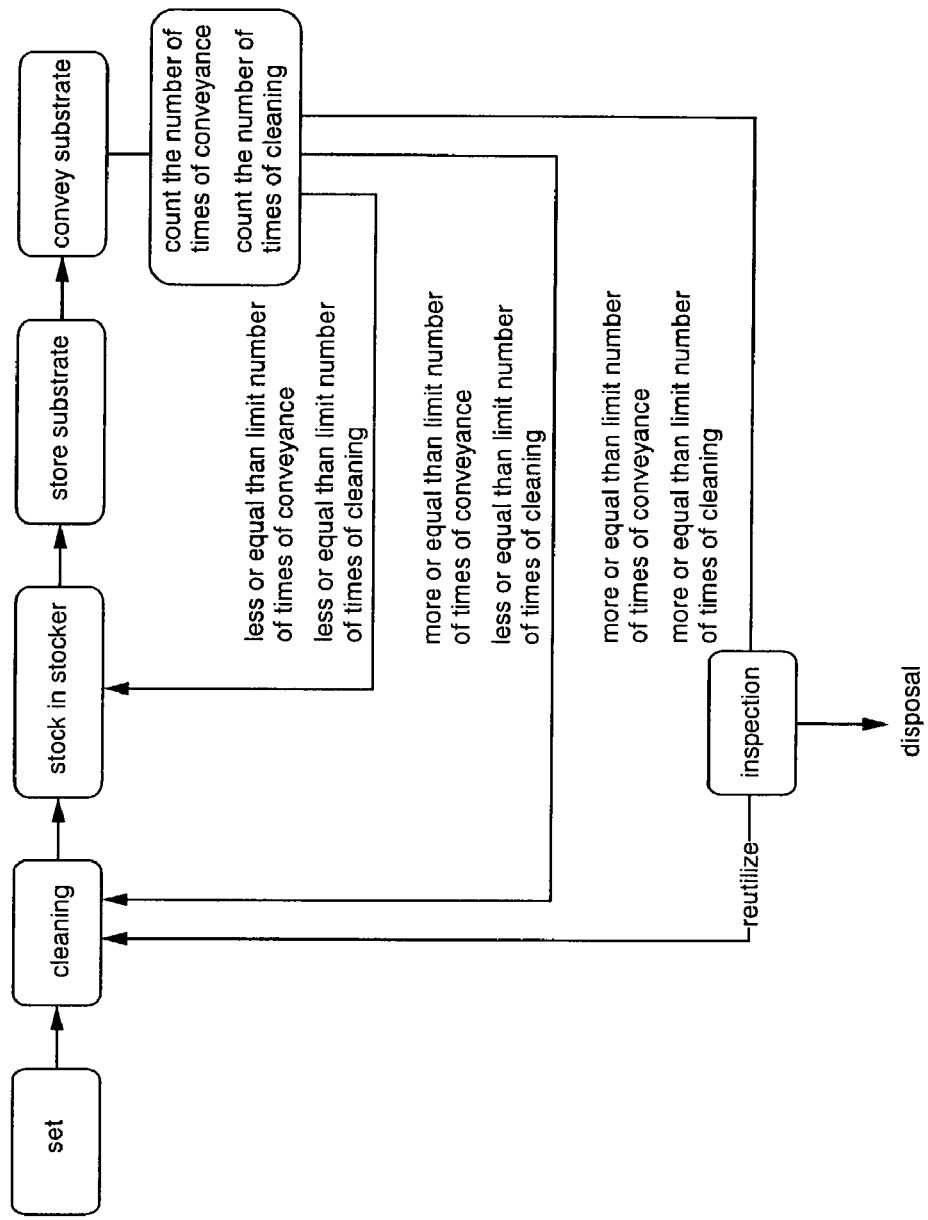
FIG. 8 is a diagram showing timing for cleaning the carrier.

FIG. 8 shows a flow of a carrier in a manufacturing line. When a carrier is set in the manufacturing line, the carrier is cleaned and, thereafter, carrier information memory means is installed in the carrier. Then, a carrier ID given to the carrier is stored in the carrier information memory means.

Then, the carrier is conveyed by carrier conveying means and stocked in a stocker of each manufacturing apparatus. A substrate processed in a manufacturing apparatus is stored in the carrier.

The carrier in which the substrate is stored is conveyed to a manufacturing apparatus in which the next processing is performed. The number of times of conveyance of the carrier from a manufacturing apparatus to another manufacturing apparatus is counted, and a host computer decides whether the counted number of times is larger or smaller than a set limit number of times (limit number of times of conveyance).

If the counted number of times is smaller than the limit number of times of conveyance, the carrier is directly conveyed to the next manufacturing apparatus, and the above-mentioned operations are repeated. If the counted number of times is larger than the limit number of times of conveyance, the carrier is automatically conveyed to a cleaning apparatus that automatically cleans the carrier. Then, when the carrier is cleaned in the cleaning apparatus, the carrier is stocked in the stocker of the manufacturing apparatus again, and the above-mentioned operations are started.

Further, the number of times of conveyance of the carrier may be counted in the manufacturing apparatus and stored in the carrier information memory means provided in the carrier or may be stored in a memory that is provided in the host computer.

In addition, in the case in which the number of times of conveyance is smaller than the limit number of times of conveyance, if a request for bringing in an empty carrier is sent to the host computer from a manufacturing apparatus, empty carriers may be selected in order from the one with less number of times of conveyance to be conveyed to the manufacturing apparatus that sends the request.

Further, the number of times of cleaning of a carrier is counted, and the host computer decides if the counted number of times is larger or smaller than a set limit number of times (limit number of times of cleaning). The counted number of times of cleaning of the carrier may be counted and stored in the carrier information memory means provided in the carrier or may be stored in a memory that is provided in the host computer.

If the number of times of cleaning is stored in the carrier information memory means, the carrier information memory means may be removed from the carrier before cleaning and installed in the carrier after the cleaning is finished. At this point, the carrier information memory means may be disposed of before cleaning to install new carrier information memory means or the same carrier information memory means as before the cleaning may be installed. If the new carrier information memory means is installed, information stored in the carrier information memory means to be disposed of may be stored in the host computer once, and the information stored in the host computer may be written in the new carrier information memory means after the cleaning. However, regardless of whether the carrier information memory means is discarded or not, it is of vital importance to reset the number of times of cleaning stored in the carrier information memory means.

If the number of times of cleaning is smaller than the limit number of times of cleaning, the carrier is directly conveyed to the next manufacturing apparatus, and the above-mentioned operations are repeated. If the number of times of cleaning is larger than the limit number of times of cleaning, the carrier is inspected, and a worker decides whether the carrier is reutilized directly or after applying appropriate treatment or is disposed of. If the carrier is reutilized, it is cleaned in the cleaning apparatus and stocked in the stocker of the manufacturing apparatus again, and the above-mentioned operations are started.

This embodiment can be implemented in combination with the first embodiment.

With the structure of the present invention, even if decision of a recipe and an order of work of a manufacturing apparatus is managed by the unit of substrate rather than by the unit of carrier, since it is unnecessary to manage concrete contents of a recipe for each substrate in each manufacturing apparatus in the host computer, burden on the host computer can be reduced. In addition, since it becomes unnecessary to exchange data of a large information amount such as concrete contents of a recipe for each substrate between the host computer and each manufacturing apparatus, time required for transmission and reception of data can be controlled, and a high performance is not required of the host computer.

In addition, since substrates can be stored in a carrier regardless of a type of a lot, a ratio of the number of substrates that are actually stored to the number of substrates that can be stored in the carrier can be increased, and conveyance of a substrate between each manufacturing apparatus can be performed efficiently.

Thus, it is seen that a management system and a management method for managing a production line are provided. One skilled in the art will appreciate that the present invention can be practiced by other than the preferred embodiments which are presented for the purposes of illustration and not of limitation, and the present invention is limited only by the claims which follow.

What is claimed is:

1. A management method for a production line of a display device, comprising:

storing a plurality of substrates in a carrier provided with memory means; and conveying said carrier in which said plurality of substrates are stored to a manufacturing apparatus, wherein identification information of each of said plurality of substrates stored in said carrier and a lot number of each of said plurality of substrates are stored in said memory means magnetically, wherein said identification information of each of said plurality of substrates and said lot number of each of said plurality of substrates stored in said memory means are read in said manufacturing apparatus by a reading means and sent to a host computer together with identification information of said manufacturing apparatus, wherein a memory in which a recipe number in each process of each lot is stored is provided in said host computer, wherein said host computer uses said identification information of each of said plurality of substrates, said lot number of each of said plurality of substrates and said identification information of said manufacturing apparatus to read out a recipe number corresponding to each of said plurality of substrates and sends the recipe number to said manufacturing apparatus, wherein said manufacturing apparatus processes each of said plurality of substrates in accordance with a recipe corresponding to said recipe number sent from said host computer among said plurality of recipes stored in said memory provided in said manufacturing apparatus, wherein when there is no recipe for one of the plurality of substrates corresponding to the recipe number sent from the host computer in the memory provided in the manufacturing apparatus, the substrate is removed from the lot, wherein the substrate which has been removed from the lot is conveyed in the carrier with other substrates, and wherein the memory means stores an information that the substrate has been removed from the lot.

2. A management method according to claim 1, wherein said manufacturing apparatus and said reading means are not separated with each other.

3. A management method for a production line of a display device, comprising:

storing a plurality of substrates in a carrier provided with memory means; and controlling carrier conveying means in a host computer such that said carrier in which said plurality of substrates are stored is conveyed to a manufacturing apparatus, wherein identification information of each of said plurality of substrates stored in said carrier and a lot number of each of said plurality of substrates are stored magnetically in said memory means, wherein said identification information of each of said plurality of substrates stored in said memory means and said lot number of each of said plurality of substrates are read in said manufacturing apparatus by a reading means and sent to said host computer together with identification information of said manufacturing apparatus, wherein a memory in which a recipe number in each process of each lot is stored is provided in said host computer, wherein said host computer uses said identification information of each of said plurality of substrates, said lot number of each of said plurality of substrates and said identification information of said manufacturing apparatus to read out a recipe number corresponding to each of said plurality of substrates and sends the recipe number to said manufacturing apparatus, wherein said manufacturing apparatus processes each of said plurality of substrates in accordance with a recipe corresponding to said recipe number sent from said host computer among said plurality of recipes stored in said memory provided in said manufacturing apparatus, wherein when there is no recipe for one of the plurality of substrates corresponding to the recipe number sent from the host computer in the memory provided in the manufacturing apparatus, the substrate comes to be removed from the lot, wherein the substrate which has been removed from the lot is conveyed in the carrier with other substrates, and wherein the memory means stores an information that the substrate has been removed from the lot.

4. A management method according to claim 3, wherein said manufacturing apparatus and said reading means are not separated with each other.

5. A management method for a production line of a display device, comprising:

storing a plurality of substrates in a carrier provided with memory means; and conveying said carrier in which said plurality of substrates are stored to a first manufacturing apparatus, wherein identification information of each of said plurality of substrates stored in said carrier and a lot number of each of said plurality of substrates are stored magnetically in said memory means, wherein said identification information of each of said plurality of substrates stored in said memory means and said lot number of each of said plurality of substrates are read in said first manufacturing apparatus by a reading means and sent to a host computer together with identification information of said first manufacturing apparatus, wherein a memory in which a recipe number in each process of each lot is stored is provided in said host computer, wherein said host computer uses said identification information of each of said plurality of substrates, said lot number of each of said plurality of substrates and said identification information of said first manufacturing apparatus to read out a recipe number corresponding to each of said plurality of substrates and sends the recipe number to said first manufacturing apparatus, wherein said first manufacturing apparatus processes each of said plurality of substrates in accordance with a recipe corresponding to said recipe number sent from said host computer among said plurality of recipes stored in said memory provided in said first manufacturing apparatus, wherein, when all the processing of said plurality of substrates is completed, the completion of the processing is sent to said host computer as information from said first manufacturing apparatus, wherein, upon receiving the completion of the processing as information, said host computer decides a second manufacturing apparatus to be used in the next process based on each process of each lot stored in said memory of said host computer, and conveying said carrier to said second manufacturing apparatus, wherein when there is no recipe for one of the plurality of substrates corresponding to the recipe number sent from the host computer in the memory provided in the manufacturing apparatus, the substrate comes to be removed from the lot, wherein the substrate which has been removed from the lot is conveyed in the carrier with other substrates, and wherein the memory means stores an information that the substrate has been removed from the lot.

6. A management method according to claim 3, wherein said first manufacturing apparatus and said reading means are not separated with each other.

7. A management method, for a production line of a display device, comprising:

storing a plurality of substrates in a carrier provided with memory means; and controlling carrier conveying means in a host computer such that said carrier in which said plurality of substrates are stored is conveyed to a first manufacturing apparatus, wherein identification information of each of said plurality of substrates stored in said carrier and a lot number of each of said plurality of substrates are stored magnetically in said memory means, wherein said identification information of each of said plurality of substrates stored in said memory means and said lot number of each of said plurality of substrates are read in said first manufacturing apparatus by a reading means and sent to said host computer together with identification information of said first manufacturing apparatus, wherein a memory in which a recipe number in each process of each lot is stored is provided in said host computer, wherein said host computer uses said identification information of each of said plurality of substrates, said lot number of each of said plurality of substrates and said identification information of said first manufacturing apparatus to read out a recipe number corresponding to each of said plurality of substrates and sends the recipe number to said first manufacturing apparatus, wherein said first manufacturing apparatus processes each of said plurality of substrates in accordance with a recipe corresponding to said recipe number sent from said host computer among said plurality of recipes stored in said memory provided in said first manufacturing apparatus, wherein, when all the processing of said plurality of substrates is completed, the completion of the processing is sent to said host computer as information from said first manufacturing apparatus, wherein, upon receiving the completion of the processing as information, said host computer decides a second manufacturing apparatus to be used in the next process based on each process of each lot stored in said memory of said host computer, and controls said carrier conveying means such that said carrier is conveyed to said second manufacturing apparatus, wherein when there is no recipe for one of the plurality of substrates corresponding to the recipe number sent from the host computer in the memory provided in the manufacturing apparatus, the substrate comes to be removed from the lot, wherein the substrate which has been removed from the lot is conveyed in the carrier with other substrates, and wherein the memory means stores an information that the substrate has been removed from the lot.

8. A management method according to claim 7, wherein said first manufacturing apparatus and said reading means are not separated with each other.

9. A management method, for a production line of a display device that conveys a carrier in which a plurality of substrates are stored among a plurality of manufacturing apparatuses and applies processing to each of said plurality of substrates in each of said plurality of manufacturing apparatuses, wherein:

said carrier is provided with identification information of each of said plurality of substrates stored in said carrier and memory means in which a lot number of each of said plurality of substrates are magnetically stored;

said identification information of each of said plurality of substrates stored in said memory means and said lot number of each of said plurality of substrates are read in each of said plurality of manufacturing apparatuses by a reading means and sent to a host computer together with identification information of each of said plurality of manufacturing apparatuses;

a memory in which a recipe number in each process of each lot is stored is provided in said host computer;

said host computer uses said identification information of each of said plurality of substrates, said lot number of each of said plurality of substrates and said identification information of each of said plurality of manufacturing apparatuses to read out a recipe number corresponding to each of said plurality of substrates and sends the recipe number to each of said plurality of manufacturing apparatuses;

each of said plurality of manufacturing apparatuses processes each of said plurality of substrates in accordance with a recipe corresponding to said recipe number sent from said host computer among a plurality of recipes stored in a memory provided in each of said plurality of manufacturing apparatuses;

when all the processing of said plurality of substrates is completed, the completion of the processing is sent to said host computer as information from each of said plurality of manufacturing apparatuses;

upon receiving the completion of the processing as information, said host computer decides a manufacturing apparatus to be used in the next process among said plurality of manufacturing apparatuses based on each process of each lot stored in said memory of said host computer, and conveys said carrier to said manufacturing apparatus to be used in the next process;

when there is no recipe for one of the plurality of substrates corresponding to the recipe number sent from the host computer in the memory provided in the manufacturing apparatus, the substrate comes to be removed from the lot;

the substrate which has been removed from the lot is conveyed in the carrier with other substrates; and the memory means stores an information that the substrate has been removed from the lot.

10. A management method according to claim 9, wherein each of said plurality of manufacturing apparatuses and said reading means are not separated with each other.

11. A management method, for a production line of a display device that conveys a carrier in which a plurality of substrates are stored among a plurality of manufacturing apparatuses and applies processing to each of said plurality of substrates in each of said plurality of manufacturing apparatuses, wherein:

said carrier is provided with identification information of each of said plurality of substrates stored in said carrier and memory means in which a lot number of each of said plurality of substrates are magnetically stored;

said identification information of each of said plurality of substrates stored in said memory means and said lot number of each of said plurality of substrates are read in each of said plurality of manufacturing apparatuses by a reading means and sent to a host computer together with identification information of each of said plurality of manufacturing apparatuses;

a memory in which a recipe number in each process of each lot is stored is provided in said host computer;

said host computer uses said identification information of each of said plurality of substrates, said lot number of each of said plurality of substrates and said identification information of each of said plurality of manufacturing apparatuses to read out a recipe number corresponding to each of said plurality of substrates and sends the recipe number to each of said plurality of manufacturing apparatuses;

each of said plurality of manufacturing apparatuses processes each of said plurality of substrates in accordance with a recipe corresponding to said recipe number sent from said host computer among a plurality of recipes stored in a memory provided in each of said plurality of manufacturing apparatuses;

when all the processing of said plurality of substrates is completed, the completion of the processing is sent to said host computer as information from each of said plurality of manufacturing apparatuses;

upon receiving the completion of the processing as information, said host computer decides a manufacturing apparatus to be used in the next process among said plurality of manufacturing apparatuses based on each process of each lot stored in said memory of said host computer, and conveys said carrier to said manufacturing apparatus to be used in the next process;

the number of times said carrier is conveyed between each of said plurality of manufacturing apparatuses is counted in said host computer;

when said counted number of times exceeds a fixed number of times, said carrier is cleaned;

when there is no recipe for one of the plurality of substrates corresponding to the recipe number sent from the host computer in the memory provided in the manufacturing apparatus, the substrate comes to be removed from the lot;

the substrate which has been removed from the lot is conveyed in the carrier with other substrates; and the memory means stores an information that the substrate has been removed from the lot.

12. A management method according to claim 11, wherein each of said plurality of manufacturing apparatuses and said reading means are not separated with each other.

13. A management method for a production line of a display device that conveys a carrier in which a plurality of substrates are stored among a plurality of manufacturing apparatuses and applies processing to each of said plurality of substrates in each of said plurality of manufacturing apparatuses, wherein:

said carrier is provided with identification information of each of said plurality of substrates stored in said carrier and memory means in which a lot number of each of said plurality of substrates are magnetically stored;

said identification information of each of said plurality of substrates stored in said memory means and said lot number of each of said plurality of substrates are read in each of said plurality of manufacturing apparatuses by a reading means and sent to a host computer together with identification information of each of said plurality of manufacturing apparatuses;

a memory in which a recipe number in each process of each lot is stored is provided in said host computer;

said host computer uses said identification information of each of said plurality of substrates, said lot number of each of said plurality of substrates and said identification information of each of said plurality of manufacturing apparatuses to read out a recipe number corresponding to each of said plurality of substrates and sends the recipe number to each of said plurality of manufacturing apparatuses;

each of said plurality of manufacturing apparatuses processes each of said plurality of substrates in accordance with a recipe corresponding to said recipe number sent from said host computer among a plurality of recipes stored in a memory provided in each of said plurality of manufacturing apparatuses;

when all the processing of said plurality of substrates is completed, the completion of the processing is sent to said host computer as information from each of said plurality of manufacturing apparatuses;

upon receiving the completion of the processing as information, said host computer decides a manufacturing apparatus to be used in the next process among said plurality of manufacturing apparatuses based on each process of each lot stored in said memory of said host computer, and conveys said carrier to said manufacturing apparatus to be used in the next process;

the number of times said carrier is conveyed between each of said plurality of manufacturing apparatuses is counted in said host computer;

said number of times said carrier is conveyed is stored in said memory means;

when said counted number of times exceeds a fixed number of times, said carrier is cleaned;

when there is no recipe for one of the plurality of substrates corresponding to the recipe number sent from the host computer in the memory provided in the manufacturing apparatus, the substrate comes to be removed from the lot;

the substrate which has been removed from the lot is conveyed in the carrier with other substrates; and the memory means stores an information that the substrate has been removed from the lot.

14. A management method according to claim 13, wherein each of said plurality of manufacturing apparatuses and said reading means are not separated with each other.

15. A management system for a production line of a display device, comprising:

a carrier in which memory means is provided and a plurality of substrates are stored;

first means for conveying said carrier;

a plurality of manufacturing apparatuses; and a host computer, wherein identification information of each of said plurality of substrates stored in said carrier and a lot number of each of said plurality of substrates are stored magnetically in said memory means, wherein each of said plurality of manufacturing apparatuses comprises second means for reading said identification information of each of said plurality of substrates and said lot number of each of said plurality of substrates stored in said memory means, third means for sending said identification information of each of said plurality of substrates and said lot number of each of said plurality of substrates, which are read by said second means, and identification information of each of said plurality of manufacturing apparatuses to said host computer, a first memory in which a plurality of recipes are stored, and fourth means for applying processing to each of said plurality of substrates, wherein said host computer comprises a second memory in which a recipe number in each process of each lot is stored, a third memory in which identification information of a manufacturing apparatus in each process of each lot is stored, fifth means for reading out a recipe number corresponding to each of said plurality of substrates stored in said second memory based on said identification information of each of said plurality of substrates, said lot number of each of said plurality of substrates and said identification information of each of said manufacturing apparatuses, which are sent from each of said manufacturing apparatuses, and sending the recipe number to each of said manufacturing apparatuses, and counter means, wherein each of said manufacturing apparatus reads out a recipe corresponding to said recipe number sent from said host computer among said plurality of recipes stored in said first memory and sends said read out recipe to said fourth means in said third means, and processes each of said plurality of substrates in accordance with the sent recipe in said fourth means, wherein, when all the processing of said plurality of substrates is completed in said fourth means, the completion of the processing is sent to said host computer as information by said third means, wherein, when the completion of the processing is sent to said host computer as information, an apparatus to be used in the next process is decided among said plurality of manufacturing apparatuses based on said identification information of a manufacturing apparatus corresponding to each process of each lot stored in said third memory by said fifth means, thereby said carrier is conveyed to said apparatus to be used in the next process by controlling said first means, wherein the number of times said carrier is conveyed between each of said plurality of manufacturing apparatuses is counted in said counter means, wherein, when said counted number of times exceeds a fixed number of times, said carrier is cleaned, wherein a number of times of cleaning of the carrier is counted, and wherein when the number of times of cleaning is larger than a limit number of times of cleaning, the carrier is inspected, and it is decided whether the carrier is reutilized or disposed.

16. A management system according to claim 15, wherein each of said plurality of manufacturing apparatuses and said second means are not separated with each other.

17. A management system for a production line of a display device, comprising:
a carrier in which memory means is provided and a plurality of substrates are stored;
first means for conveying said carrier;
a plurality of manufacturing apparatuses; and
a host computer,
wherein identification information of each of said plurality of substrates stored in said carrier and a lot number of each of said plurality of substrates are stored magnetically in said memory means,
wherein each of said plurality of manufacturing apparatuses comprises second means for reading said identification information of each of said plurality of substrates and said lot number of each of said plurality of substrates stored in said memory means, third means for sending said identification information of each of said plurality of substrates and said lot number of each of said plurality of substrates, which are read by said second means, and identification information of each of said plurality of manufacturing apparatuses to said host computer, a first memory in which a plurality of recipes are stored, and fourth means for applying processing to each of said plurality of substrates, wherein said host computer comprises a second memory in which a recipe number in each process of each lot is stored, a third memory in which identification information of a manufacturing apparatus in each process of each lot is stored, fifth means for reading out a recipe number corresponding to each of said plurality of substrates stored in said second memory based on said identification information of each of said plurality of substrates, said lot number of each of said plurality of substrates and said identification information of each of said manufacturing apparatuses, which are sent from each of said manufacturing apparatuses, and sending the recipe number to each of said manufacturing apparatuses, and counter means, wherein each of said manufacturing apparatus reads out a recipe corresponding to said recipe number sent from said host computer among said plurality of recipes stored in said first memory and sends said read out recipe to said fourth means in said third means, and processes each of said plurality of substrates in accordance with the sent recipe in said fourth means, wherein, when all the processing of said plurality of substrates is completed in said fourth means, the completion of the processing is sent to said host computer as information by said third means, wherein, when the completion of the processing is sent to said host computer as information, an apparatus to be used in the next process is decided among said plurality of manufacturing apparatuses based on said identification information of a manufacturing apparatus corresponding to each process of each lot stored in said third memory by said fifth means, thereby said carrier is conveyed to said apparatus to be used in the next process by controlling said first means, wherein the number of times said carrier is conveyed between each of said plurality of manufacturing apparatuses is counted in said counter means, wherein said number of times said carrier is conveyed is stored in said memory means, wherein, when said counted number of times exceeds a fixed number of times, said carrier is cleaned, wherein a number of times of cleaning of the carrier is counted, and wherein when the number of times of cleaning is larger than a limit number of times of cleaning, the carrier is inspected, and it is decided whether the carrier is reutilized or disposed.

18. A management system according to claim 17, wherein each of said plurality of manufacturing apparatuses and said first means are not separated with each other.

19. A management method for a production line of a display device that conveys a carrier in which a plurality of substrates are stored among a plurality of manufacturing apparatuses and applies processing to each of said plurality of substrates in each of said plurality of manufacturing apparatuses, wherein:

said carrier is provided with identification information of each of said plurality of substrates stored in said carrier and memory means in which a lot number of each of said plurality of substrates are magnetically stored;

said identification information of each of said plurality of substrates stored in said memory means and said lot number of each of said plurality of substrates are read in each of said plurality of manufacturing apparatuses by a reading means and sent to a host computer together with identification information of each of said plurality of manufacturing apparatuses;

a memory in which a recipe number in each process of each lot is stored is provided in said host computer;

said host computer uses said identification information of each of said plurality of substrates, said lot number of each of said plurality of substrates and said identification information of each of said plurality of manufacturing apparatuses to read out a recipe number corresponding to each of said plurality of substrates and sends the recipe number to each of said plurality of manufacturing apparatuses;

each of said plurality of manufacturing apparatuses processes each of said plurality of substrates in accordance with a recipe corresponding to said recipe number sent from said host computer among a plurality of recipes stored in a memory provided in each of said plurality of manufacturing apparatuses;

when all the processing of said plurality of substrates is completed, the completion of the processing is sent to said host computer as information from each of said plurality of manufacturing apparatuses;

upon receiving the completion of the processing as information, said host computer decides a manufacturing apparatus to be used in the next process among said plurality of manufacturing apparatuses based on each process of each lot stored in said memory of said host computer, and conveys said carrier to said manufacturing apparatus to be used in the next process;

the number of times said carrier is conveyed between each of said plurality of manufacturing apparatuses is counted in said host computer;

when said counted number of times exceeds a fixed number of times, said carrier is cleaned;

a number of times of cleaning of the carrier is counted; and when the number of times of cleaning is larger than a limit number of times of cleaning, the carrier is inspected, and it is decided whether the carrier is reutilized or disposed.

20. A management method according to claim 19, wherein each of said plurality of manufacturing apparatuses and said reading means are not separated with each other.

21. A management method for a production line of a display device that conveys a carrier in which a plurality of substrates are stored among a plurality of manufacturing apparatuses and applies processing to each of said plurality of substrates in each of said plurality of manufacturing apparatuses, wherein:

said carrier is provided with identification information of each of said plurality of substrates stored in said carrier and memory means in which a lot number of each of said plurality of substrates are magnetically stored;

said identification information of each of said plurality of substrates stored in said memory means and said lot number of each of said plurality of substrates are read in each of said plurality of manufacturing apparatuses by a reading means and sent to a host computer together with identification information of each of said plurality of manufacturing apparatuses;

a memory in which a recipe number in each process of each lot is stored is provided in said host computer;

said host computer uses said identification information of each of said plurality of substrates, said lot number of each of said plurality of substrates and said identification information of each of said plurality of manufacturing apparatuses to read out a recipe number corresponding to each of said plurality of substrates and sends the recipe number to each of said plurality of manufacturing apparatuses;

each of said plurality of manufacturing apparatuses processes each of said plurality of substrates in accordance with a recipe corresponding to said recipe number sent from said host computer among a plurality of recipes stored in a memory provided in each of said plurality of manufacturing apparatuses;

when all the processing of said plurality of substrates is completed, the completion of the processing is sent to said host computer as information from each of said plurality of manufacturing apparatuses;

upon receiving the completion of the processing as information, said host computer decides a manufacturing apparatus to be used in the next process among said plurality of manufacturing apparatuses based on each process of each lot stored in said memory of said host computer, and conveys said carrier to said manufacturing apparatus to be used in the next process;

the number of times said carrier is conveyed between each of said plurality of manufacturing apparatuses is counted in said host computer;

said number of times said carrier is conveyed is stored in said memory means;

when said counted number of times exceeds a fixed number of times, said carrier is cleaned;

a number of times of cleaning of the carrier is counted; and when the number of times of cleaning is larger than a limit number of times of cleaning, the carrier is inspected, and it is decided whether the carrier is reutilized or disposed.

22. A management method according to claim 21, wherein each of said plurality of manufacturing apparatuses and said reading means are not separated with each other.

* * * * *